United States Patent
Lee et al.

(10) Patent No.: US 8,552,455 B2
(45) Date of Patent: Oct. 8, 2013

(54) SEMICONDUCTOR LIGHT-EMITTING DIODE AND A PRODUCTION METHOD THEREFOR

(75) Inventors: Jong Lam Lee, Pohang-Si (KR); Yang Hee Song, Seongnam-si (KR); Jun Ho Son, Pohang-si (KR); Buem Joon Kim, Goyang-si (KR)

(73) Assignees: Seoul Opto Device Co., Ltd., Ansan-si (KR); Postech Academy-Industry Foundation, Pohang-si (KR)

( * ) Notice: Subject to any disclaimer, the term of this patent is extended or adjusted under 35 U.S.C. 154(b) by 71 days.

(21) Appl. No.: 13/394,714

(22) PCT Filed: Sep. 7, 2010

(86) PCT No.: PCT/KR2010/006056
§ 371 (c)(1),
(2), (4) Date: Mar. 7, 2012

(87) PCT Pub. No.: WO2011/028076
PCT Pub. Date: Mar. 10, 2011

(65) Prior Publication Data
US 2012/0168803 A1    Jul. 5, 2012

(30) Foreign Application Priority Data

Sep. 7, 2009  (KR) .................. 10-2009-0084086
Sep. 7, 2009  (KR) .................. 10-2009-0084087

(51) Int. Cl.
*H01L 33/60*    (2010.01)
(52) U.S. Cl.
USPC .......................................... 257/98; 438/29

(58) Field of Classification Search
USPC ........................................................ 257/98
See application file for complete search history.

(56) References Cited

U.S. PATENT DOCUMENTS

| | | |
|---|---|---|
| 2005/0133803 A1 | 6/2005 | Seong et al. |
| 2007/0034857 A1 | 2/2007 | Song |
| 2009/0166666 A1 | 7/2009 | Yao et al. |

FOREIGN PATENT DOCUMENTS

| | | |
|---|---|---|
| JP | 10-215034 | 8/1998 |
| JP | 2008-130953 | 6/2008 |
| KR | 10-2005-0063293 | 6/2005 |
| KR | 10-2005-0088961 | 9/2005 |
| KR | 10-2005-0095723 | 9/2005 |

OTHER PUBLICATIONS

International Search Report of PCT/KR2010/006056 mailed Mar. 31, 2011.

*Primary Examiner* — Telly Green
*Assistant Examiner* — Damian A Hillman
(74) *Attorney, Agent, or Firm* — H.C. Park & Associates, PLC

(57) ABSTRACT

Provided is a semiconductor light-emitting diode including a semiconductor layer having a light-emitting structure; and an ohmic electrode incorporating a nanodot layer, a contact layer, a diffusion-preventing layer and a capping layer on the semiconductor layer. The nanodot layer is formed on the N-polar surface of the semiconductor layer and is formed from a substance comprising at least one of Ag, Al and Au. Also provided is a production method therefor. In the ohmic electrode which has the multi-layer structure comprising the nanodot layer/contact layer/diffusion-preventing layer/capping layer in the semiconductor light-emitting diode of this type, the nanodot layer constitutes the N-polar surface of a nitride semiconductor and improves the charge-injection characteristics such that outstanding ohmic characteristics can be obtained.

21 Claims, 9 Drawing Sheets

SEMICONDUCTOR LIGHT-EMITTING DIODE AND A PRODUCTION METHOD THEREFOR

CROSS-REFERENCE RELATED APPLICATIONS

This application is the National Stage Entry of International Application PCT/KR2010/006056, filed on Sep. 7, 2010, and claims priority from and the benefit of Korean Patent Application Nos. 10-2009-0084086, filed on Sep. 7, 2009, and 10-2009-0084087, filed on Sep. 7, 2009, all of which are herein incorporated by reference for all purposes as if fully set forth herein.

FIELD OF THE INVENTION

The present invention relates to a semiconductor light emitting diode and a method of manufacturing the same, and more particularly, to a semiconductor light emitting diode and a method of manufacturing the same, which includes an ohmic electrode formed on a semiconductor layer of a light emitting structure and used for application of an external power source.

DISCUSSION OF THE BACKGROUND

A semiconductor light emitting diode (LED) has a long lifespan, permits a reduction in size and weight, exhibits strong orientation of light, and can be operated at low voltage. In addition, the semiconductor light emitting diode has high resistance against impact and vibration, does not require preheating and a complex drive circuit, and may be packaged in various shapes. Particularly, a nitride-based semiconductor light emitting diode has attracted much attention, since it has a high energy band gap to allow light output in a wide wavelength band from ultraviolet to blue/red colors and exhibits excellent physical/chemical stability to realize high efficiency and high output. Since such nitride semiconductor LEDs permit emission of white light through combination with existing red and green LEDs, it is expected that the nitride LED will replace existing incandescent lamps, fluorescent lamps, mercury lamps, and white lighting devices within several years.

However, conventional nitride-based LEDs are not satisfactory in terms of light output, luminous efficacy and price, and need improved performance. Particularly, the conventional LED needs improved light output, which is still lower than that of existing white light sources, and to overcome the problem of thermal stability caused by improving light output.

Meanwhile, a typical nitride semiconductor light emitting diode is manufactured by forming a nitride-based n-type layer, a nitride-based active layer and a nitride-based p-type layer on a sapphire substrate, and horizontally placing two electrodes for application of a power source to the n-type layer and the p-type layer. Since such a lateral type light emitting diode may be manufactured through a relatively simple process, it is advantageous in terms of low manufacturing cost, but the use of the sapphire substrate which is an insulator and exhibits low thermal conductivity leads to degradation in thermal stability upon high output and heat accumulation through application of electric current to large area.

To overcome such problems of the typical light emitting diode, a vertical type semiconductor light emitting diode and a flip chip type semiconductor light emitting diode are suggested. In such structure, a reflective layer is formed on a p-type electrode and allows light generated in an active layer to be emitted to the outside through an n-type electrode, and, instead of the sapphire substrate, a metal substrate having high thermal conductivity is used to allow application of electric current to large area and rapid heat dissipation, thereby securing high output and thermal stability. Since such a vertical type semiconductor light emitting diode achieves high output through an increase in maximum application current several times above that of the lateral type semiconductor light emitting diode, it is evaluated that the vertical type semiconductor light emitting diode can replace existing white lighting devices.

Meanwhile, in order to improve operating voltage characteristics of the vertical type semiconductor light emitting diode, the n-type electrode should have low resistance characteristics. For the vertical type semiconductor light emitting diode, a metal substrate or a semiconductor substrate such as Si, Ge, and the like is used as a support substrate and the sapphire substrate is removed via laser lift-off (LLO). At this time, it is difficult to perform annealing at high temperature after laser lift-off due to wafer bonding temperature and large difference in thermal expansion coefficients between the metal substrate and a GaN layer. Accordingly, Cr/Au and Ti/Al n-type ohmic electrodes which can be formed at room temperature without annealing are generally used in the art. However, such ohmic electrodes have a problem in that ohmic characteristics are easily deteriorated causing increase in operating voltage by heat generated during annealing for formation of a $SiO_2$ protective layer after formation of the electrodes or during injection of high electric current in a large area light emitting diode. Further, the Ti/Al electrode has problems in that Al can be easily oxidized and the Ti/Al electrode can be easily etched by various kinds of solutions. Thus, there is a need for development of an n-type ohmic electrode which may exhibit low contact resistance immediately after deposition, while satisfying excellent thermal stability in order to maintain low contact resistance after thermal treatment.

Further, a semiconductor light emitting diode should have a large area in order to achieve further improved light output upon injection of high electric current. Here, the area of the electrode, for example, an n-type electrode, is also gradually increased in order to improve current spreading characteristics upon injection of high electric current. However, since a general n-type electrode such as a Cr/Au or Ti/Al electrode uses a thick Cr or Ti layer having low reflectivity, part of the n-type electrode absorbing light from the active layer increases with increasing area of the n-type electrode, causing obstruction against improvement of light output. Accordingly, there is also a need for an n-type ohmic electrode capable of exhibiting high reflectivity with low ohmic resistance.

Moreover, in fabrication of the vertical type semiconductor light emitting diode, a nitride semiconductor layer is first formed on a base substrate, a p-type electrode is formed on an upper surface of the nitride semiconductor layer, that is, on a gallium (Ga)-face, and an n-type electrode is formed on a lower surface of the nitride semiconductor layer, that is, on a nitrogen (N)-face, by separating the base substrate after attaching an assistant substrate to the p-type electrode. However, unlike the Ga-face, it is difficult to obtain good ohmic characteristics with the N-face without annealing and the difference in thermal expansion coefficients between the assistant substrate (metal substrate) and the nitride semiconductor layer makes it difficult to perform annealing itself. As such, a conventional Cr/Au or Ti/Al electrode formed on the N-face exhibits undesired ohmic characteristics and has low thermal stability.

SUMMARY OF THE INVENTION

The present invention is directed to solving such problems, and provides a semiconductor light emitting diode and a method of manufacturing the same, which has excellent thermal stability to undergo less degradation of ohmic characteristics in a high temperature environment and includes ohmic electrodes having excellent ohmic characteristics not only at a Ga-face of a nitride semiconductor layer, but also at an N-face thereof.

In accordance with one aspect of the present invention, a semiconductor light emitting diode includes: a semiconductor layer having a light emitting structure; an ohmic electrode having a nanodot layer, a contact layer, an anti-diffusion layer and a capping layer formed on the semiconductor layer. Here, the nanodot layer is formed on an N-face of the semiconductor layer and formed of at least one of Ag, Al and Au, the contact layer is formed of at least one material selected from among Ti, Ti—Al alloys, Ti—Ni alloys, Ta, Al, W, and W—Ti alloys, the anti-diffusion layer is formed of at least one metal layer selected from among Cr, Ru, Pt, Ni, Pd, Ir, Rh, and Nb or at least one oxide layer selected from among RuOx, NiOx, IrOx, RhOx, NbOx, TiOx, TaOx, and CrOx layers, and the capping layer is formed of at least one of Au and Al.

The nanodot layer may comprise Ag dots formed at nanometer scale by depositing Ag, followed by annealing in a nitrogen atmosphere. Here, the nanodot layer may have a thickness of 5 Å to 50 Å.

The contact layer may be formed of Ti, the anti-diffusion layer may be formed of Cr, and the capping layer may be formed of Au. Here, the contact layer may have a thickness of 1 Å to 1000 Å, and the anti-diffusion layer may have a thickness of 1000 Å to 3000 Å.

The semiconductor layer may include an n-type layer, an active layer and a p-type layer, and the ohmic electrode may be formed on the N-face of the n-type layer.

In accordance with another aspect of the present invention, a method of manufacturing a semiconductor light emitting diode includes forming a semiconductor layer having a light emitting structure; forming a nanodot layer on an N-face of the semiconductor layer; and forming an ohmic electrode having a contact layer, a reflective layer, an anti-diffusion layer, and a capping layer on the nanodot layer, wherein the nanodot layer is formed of at least one of Ag, Al and Au, the contact layer is formed of at least one material selected from among Ti, Ti—Al alloys, Ti—Ni alloys, Ta, Al, W, and W—Ti alloys, the anti-diffusion layer is formed of at least one metal layer selected from among Cr, Ru, Pt, Ni, Pd, Ir, Rh, and Nb layers, or at least one oxide layer selected from among RuOx, NiOx, IrOx, RhOx, NbOx, TiOx, TaOx, and CrOx layers, and the capping layer is formed of at least one of Au and Al.

The nanodot layer may be formed by depositing Ag on the N-face of the semiconductor layer, followed by annealing in a nitrogen atmosphere.

The contact layer may be formed of Ti, the anti-diffusion layer may be formed of Cr, and the capping layer may be formed of Au.

In accordance with a further aspect of the present invention, a semiconductor light emitting diode includes: a semiconductor layer having a light emitting structure; and an ohmic electrode having a nanodot layer, a contact layer, a reflective layer, an anti-diffusion layer, and a capping layer formed on the semiconductor layer. Here, the nanodot layer is formed on an N-face of the semiconductor layer and formed of at least one of Ag, Al and Au; the contact layer is formed of at least one material selected from among Ni, Ni—Ti alloys, Ni—Al alloys, Ti—Al alloys, Mg—Al alloys, Ta, Ti, W, and W—Ti alloys; the reflective layer is formed of at least one material selected from among Al, Ag, Ag—Al alloys, Ag—Cu alloys, Ag—In alloys, Ag—Mg alloys, Al—Cu alloys, Al—In alloys, and Al—Mg alloys; the anti-diffusion layer is formed of at least one metal layer selected from among Ti, Cr, Ru, Pt, Ni, Pd, Ir, Rh, Nb, W and W—Ti alloy layers, or at least one oxide layer selected from among RuOx, NiOx, IrOx, RhOx, NbOx, TiOx, TaOx and CrOx layers, and the capping layer is formed of at least one of Au and Al.

The nanodot layer may comprise Ag dots formed at nanometer scale by depositing Ag, followed by annealing in a nitrogen atmosphere. Here, the nanodot layer may have a thickness of 5 Å to 50 Å.

The contact layer may be formed of Ni, the reflective layer may be formed of Al, the anti-diffusion layer may be formed of Ti, and the capping layer may be formed of Au. Here, the contact layer may have a thickness of 1 Å to 50 Å, and the reflective layer may have a thickness of 100 Å to 8000 Å.

The semiconductor layer may include an n-type layer, an active layer and a p-type layer, and the ohmic electrode may be formed on the N-face of the n-type layer.

In accordance with yet another aspect of the present invention, a method of manufacturing a semiconductor light emitting diode includes: forming a semiconductor layer having a light emitting structure; forming a nanodot layer on an N-face of the semiconductor layer; and forming an ohmic electrode having a contact layer, a reflective layer, an anti-diffusion layer, and a capping layer on the nanodot layer, wherein the nanodot layer is formed of at least one of Ag, Al and Au, the contact layer is formed of at least one of Ni, Ni—Ti alloys, Ni—Al alloys, Ti—Al alloys, Mg—Al alloys, Ta, Ti, W and W—Ti alloys, the reflective layer is formed of at least one material selected from among Al, Ag, Ag—Al alloys, Ag—Cu alloys, Ag—In alloys, Ag—Mg alloys, Al—Cu alloys, Al—In alloys, and Al—Mg alloys, the anti-diffusion layer is formed of at least one metal layer selected from among Ti, Cr, Ru, Pt, Ni, Pd, Ir, Rh, Nb, W and W—Ti alloy layers, or at least one oxide layer selected from among RuOx, NiOx, IrOx, RhOx, NbOx, TiOx, TaOx and CrOx layers, and the capping layer is formed of at least one of Au and Al.

The nanodot layer may be formed by depositing Ag on the N-face of the semiconductor layer, followed by annealing in a nitrogen atmosphere.

The contact layer may be formed of Ni, the reflective layer may be formed of Al, the anti-diffusion layer may be formed of Ti, and the capping layer may be formed of Au.

In an ohmic electrode of a multilayer structure including a nanodot layer/a contact layer/an anti-diffusion layer/a capping layer according to some embodiments, the nanodot layer is formed on an N-face of a nitride semiconductor and provides excellent ohmic characteristics through improvement of charge injection characteristics, and the contact layer acts as a diffusion barrier and suppresses degradation by heat generated under conditions for annealing in a nitrogen atmosphere, high temperature, and high current injection, thereby providing excellent thermal stability.

In addition, the ohmic electrode of the multilayer structure including the nanodot layer/the contact layer/the reflective layer/the anti-diffusion layer/the capping layer according to the embodiments may have excellent reflectivity, thereby preventing degradation in light output caused by absorption of light, and may exhibit excellent ohmic characteristics without separate annealing, thereby enabling high output through application of high electric current.

In particular, the ohmic electrode of the multilayer structure including the nanodot layer/the contact layer/the reflective layer/the anti-diffusion layer/the capping layer according to the embodiments may be suited to a vertical type semiconductor light emitting diode, which exhibits undesired ohmic characteristics and has a difficulty in improving ohmic characteristics even through annealing due to difference in thermal expansion coefficients between the metal substrate and the nitride semiconductor.

DETAILED DESCRIPTION

Figure 1:
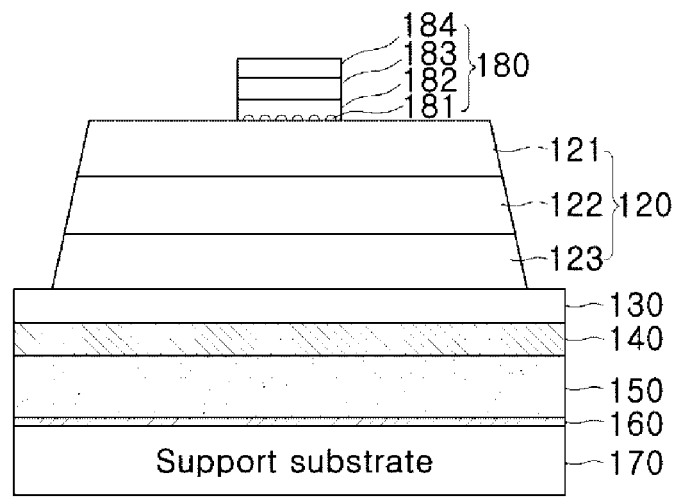
FIG. 1 is a sectional view of a semiconductor light emitting diode according to a first embodiment of the present invention.

The present invention will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough and will fully convey the scope of the invention to those skilled in the art.

In the drawings, the sizes and relative sizes of layers and regions may be exaggerated for clarity. Like reference numerals in the drawings denote like diodes. Further, it will be understood that when a diode such as a layer, layer, region or substrate is referred to as being "on" another diode, it can be directly on the other diode or intervening diodes may also be present. In contrast, when a diode is referred to as being "directly on" another diode, there are no intervening diodes present.

<Embodiment 1>

FIG. 1 is a sectional view of a semiconductor light emitting diode according to a first embodiment of the present invention.

Referring to FIG. 1, the semiconductor light emitting diode according to the first embodiment includes: a semiconductor layer 120, which includes an n-type layer 121, an active layer 122, and a p-type layer 123; an n-type electrode 180 formed on an upper surface of the n-type layer 121; and a p-type electrode 130 formed on a lower surface of the p-type layer 123. The semiconductor light emitting diode may further include a support substrate 170 attached to a lower surface of the p-type electrode 130. Here, the n-type electrode 180 is an ohmic electrode of a multilayer structure, which includes a nanodot layer 181, a contact layer 182, an anti-diffusion layer 183 and a capping layer 184 formed on the semiconductor layer 120 and is in ohmic contact with the semiconductor layer 120.

The semiconductor layer 120 includes the n-type layer 121, the active layer 122, and the p-type layer 123, and each of the n-type layer 121, the active layer 122 and the p-type layer 123 may be formed of at least one selected from among an Si layer, a GaN layer, an AlN layer, an InGaN layer, an AlGaN layer, an AlInGaN layer, and a combination thereof. For example, the n-type layer 121 and the p-type layer 123 are formed of GaN layers and the active layer 122 is formed of an InGaN layer.

Here, the n-type layer 121 is a layer which supplies electrons, and may include an n-type semiconductor layer and an n-type clad layer. The n-type semiconductor layer and the n-type clad layer may be formed by injecting n-type dopants, for example, Si, Ge, Se, Te, C, and the like, into a semiconductor layer as described above. Further, the p-type layer 123 is a layer which supplies holes, and may include a p-type semiconductor layer and a p-type clad layer. The p-type semiconductor layer and the p-type clad layer may be formed by injecting p-type dopants, for example Mg, Zn, Be, Ca, Sr, Ba, and the like, into the semiconductor layer described above.

In the active layer 220, the electrons supplied from the n-type layer 210 are recombined with the holes supplied from the p-type layer 230 to output light at certain wavelengths. The active layer 220 may be a multilayered semiconductor layer which is formed by alternately stacking a well layer and a barrier layer to have a single or multi-quantum well structure. Since the wavelengths of light emitted from the active layer 220 changes according to the semiconductor material of the active layer, the semiconductor material is suitably selected according to desired output wavelengths. For example, in this embodiment, the semiconductor layer 120 of the light emitting structure is formed by depositing a thin GaN layer, injecting n-type impurities to form an n-type layer 121, alternately depositing a thin GaN layer as a barrier layer and a thin InGaN layer as a well layer to form an active layer 122 of a multi-quantum well structure, depositing a thin GaN layer on the active layer, and injecting p-type impurities to form a p-type layer 123.

The n-type electrode 180 is disposed vertical to the p-type electrode 130, and the p-type electrode 130 constitutes a reflective plane which reflects light generated in the active layer 122 such that most light can be discharged in a direction of the n-type layer 121. The n-type electrode 180 is the ohmic electrode of the multilayer structure, which includes the nanodot layer 181, the contact layer 182, the anti-diffusion layer 183, and the capping layer 184 sequentially formed on an N-face of the semiconductor layer 120.

At this time, the nanodot layer 181 may be formed of at least one material selected from among Ag, Al and Au through annealing in a nitrogen atmosphere. In addition, the contact layer 182 may be formed of at least one material selected from among Ti, Ti—Al alloys, Ti—Ni alloys, Ta, Al, W, and W—Ti alloys, the anti-diffusion layer 183 may be formed of at least one metal layer selected from among Cr, Ru, Pt, Ni, Pd, Ir, Rh and Nb layers, or at least one oxide layer selected from among RuOx, NiOx, IrOx, RhOx, NbOx, TiOx, TaOx, and CrOx layers. Further, the capping layer 184 may be formed of at least one of Au and Al. For example, in the n-type electrode 180 according to this embodiment, the nanodot layer 181 is formed of Ag, the contact layer is formed of Ti, the anti-diffusion layer is formed of Cr, and the capping layer is formed of Au.

The support substrate 170 serves to support the entire structures 120, 130, 180, as a growth substrate of the semiconductor layer 120, that is, a base substrate, is removed. In order to allow the support substrate 170 to be attached to the lower surface of the p-type electrode 130, a capping layer 160, a bonding layer 150, and an anti-diffusion layer 140 may be formed between the support substrate 170 and the p-type electrode 130. The anti-diffusion layer 140 serves to prevent the material 120 of the p-type electrode 130 from diffusing into adjacent layers by heat during a process of bonding the p-type electrode 130 and the support substrate 170.

Next, a process of manufacturing the semiconductor light emitting diode according to this embodiment will be described with reference to FIG. 2 to FIG. 5. Here, FIG. 2 to FIG. 5 are sectional views explaining a process of manufacturing the semiconductor light emitting diode according to the first embodiment.

Figure 2:
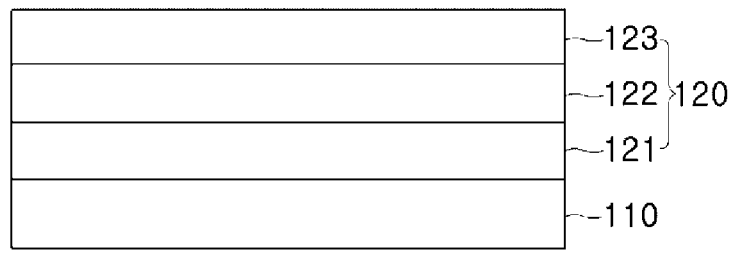
FIG. 2 to FIG. 5 are sectional views of a process for manufacturing the light emitting diode according to the first embodiment of the present invention.

Referring to FIG. 2, a semiconductor layer 120 of a multilayer structure is formed by sequentially stacking an n-type layer 121, an active layer 122 and a p-type layer 123 on a prepared substrate 110. The substrate 110 may be a sapphire ($Al_2O_3$) substrate, a silicon carbide (SiC) substrate, a silicon (Si) substrate, a zinc oxide (ZnO) substrate, a gallium arsenide (GaAs) substrate, or a gallium phosphide (GaP) substrate. Advantageously, a sapphire substrate may be used.

Figure 3:
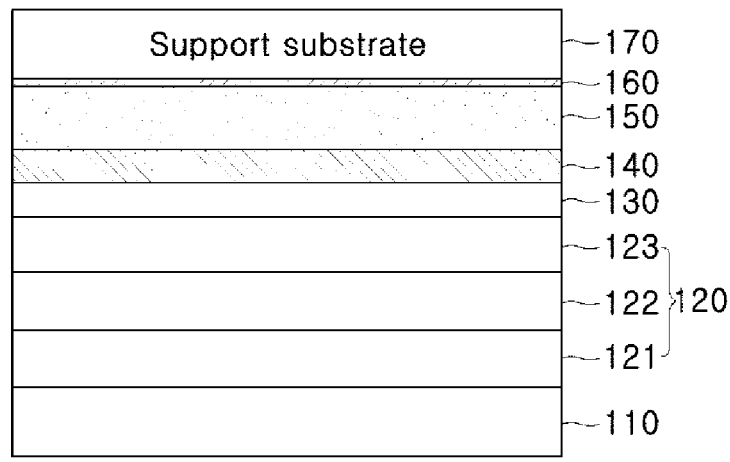

Referring to FIG. 3, a p-type electrode 130 is formed by depositing a metal layer on the semiconductor layer 120, and an anti-diffusion layer 140, a bonding layer 150 and a capping layer 160 are formed on the p-type electrode 130, followed by bonding a support substrate 170 to the capping layer 160 via a bonding process.

In this embodiment, heat bonding is used for attachment of the support substrate 170, and the anti-diffusion layer 140 is formed on the p-type electrode 130 to prevent the material of the p-type electrode 130 from diffusing during heating. Meanwhile, in order to allow most light generated in the active layer 122 to be emitted in the direction of the n-type layer 121, the p-type electrode 130 may be formed of a conductive material, for example Ag or Au, which exhibits good reflectivity, and the support substrate 170 may be a metal substrate, or a semiconductor substrate, such as Si, Ge, and the like.

Figure 4:
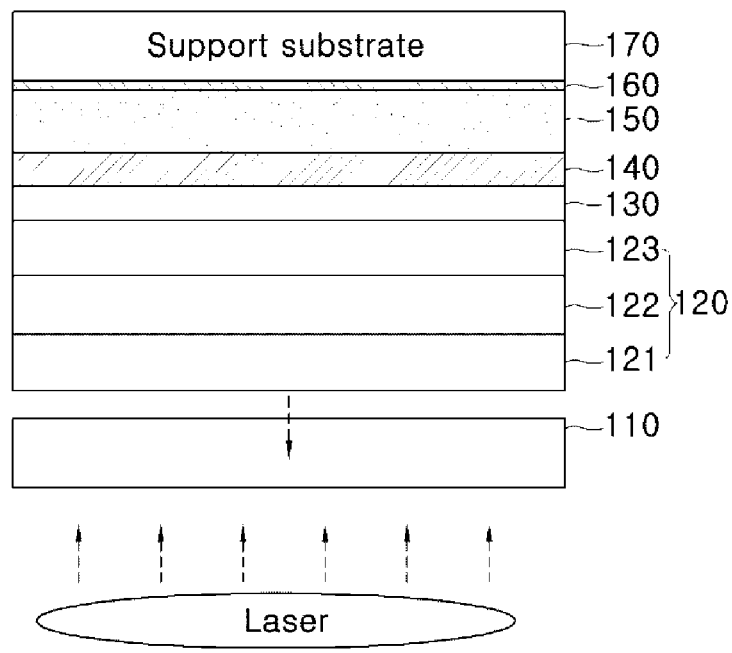
Figure 5:
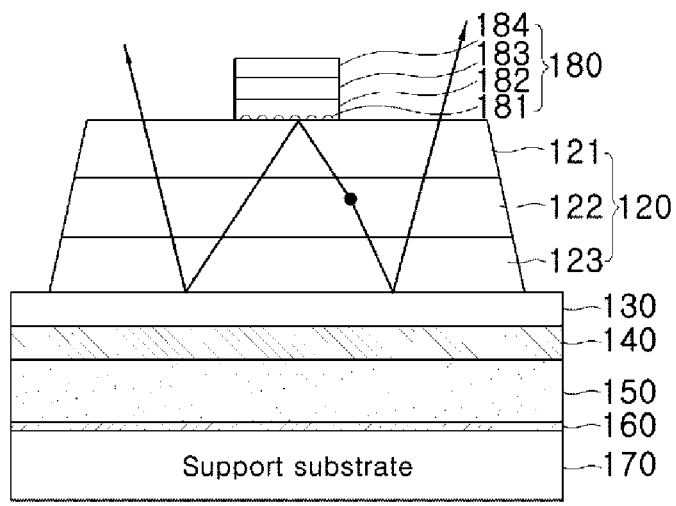

Referring to FIG. 4, a laser lift-off process is performed to remove the base substrate 110. Then, as shown in FIG. 5, with the support substrate 170 turned down, the semiconductor layer 120 attached to the upper side of the support substrate 170 is subjected to mesa etching. In some embodiments, the process may further include surface treatment with respect to the semiconductor layer 120 in order to enhance interface adhesion with an n-type electrode 180, which will be formed in a subsequent process.

Referring again to FIG. 5, Ag is thinly deposited to a thickness of about 5 Å to 50 Å on the surface of the n-type layer 121 of the exposed semiconductor layer 120, followed by annealing in a nitrogen atmosphere, thereby forming an Ag nanodot layer 181 composed of nanometer scale dots. The Ag nanodot layer 181 is formed on an N-face of the n-type layer 121. Then, a Ti contact layer 182, a Cr anti-diffusion layer 183 and an Au capping layer 184 are stacked on the Ag nanodot layer 181, followed by patterning to form an n-type electrode 180 of the Ag nanodot layer/Ti/Cr/Au structure.

Here, if the thickness of the Ag nanodot layer 181 is less than 5 Å, current injection efficiency is reduced due to an excessively small size of the dots, and if the thickness of the dot-type layer 181 is greater than 50 Å, it is difficult to form the dots. Accordingly, the Ag nanodot layer 181 is preferably formed to a thickness of 5 Å to 50 Å. If the thickness of the Ti contact layer 182 is less than 1 Å, it cannot act as the contact layer, and if the thickness of the Ti contact layer 182 is greater than 1000 Å, adhesion can be deteriorated due to an increase of stress within the thin layer resulting from the thickness increase. Thus, the Ti contact layer 182 is preferably formed to a thickness of 1 Å to 1000 Å. The Cr anti-diffusion layer 183 having a thickness of less than 1000 Å is insufficient in prevention of migration, and the Cr anti-diffusion layer 183 having a thickness greater than 3000 Å can cause degradation in electrical characteristics due to an increase in specific resistance. Thus, the Cr anti-diffusion layer 183 is preferably formed to a thickness of 1000 Å to 3000 Å. If the Au capping layer 184 has a thickness of less than 1000 Å, the capping layer 184 is not suitable for wire bonding, and if the capping layer 184 has a thickness of greater than 10000 Å, there is a problem of increase in manufacturing cost. Thus, the capping layer 184 is preferably formed to a thickness of 1000 Å to 10000 Å. Further, the n-type electrode 180 may be formed to have an overall thickness of 1000 Å to 10000 Å. In this embodiment, the Ag nanodot layer, the Ti contact layer, the Cr anti-diffusion layer and the Au capping layer are sequentially formed, for example, to thicknesses of 20 Å/500 Å/1000 Å/5000 Å on the semiconductor layer 120 by an e-beam evaporator.

Then, after forming the n-type electrode 180 and the p-type electrode 130, annealing may be further performed in an atmosphere containing nitrogen and oxygen at 150° C. to 600° C. for improvement of adhesion and ohmic characteristics while guaranteeing thermal reliability.

Meanwhile, in order to find characteristics of the n-type electrode 180 in ohmic contact with the semiconductor layer 120 in the semiconductor light emitting diode according to the first embodiment, semiconductor light emitting diodes according to an inventive example and a conventional example were prepared. The inventive example employed the Ag nanodot layer/Ti/Cr/Au ohmic electrode according to the first embodiment, and the comparative example employed a conventional Cr/Au ohmic electrode.

Figure 6:
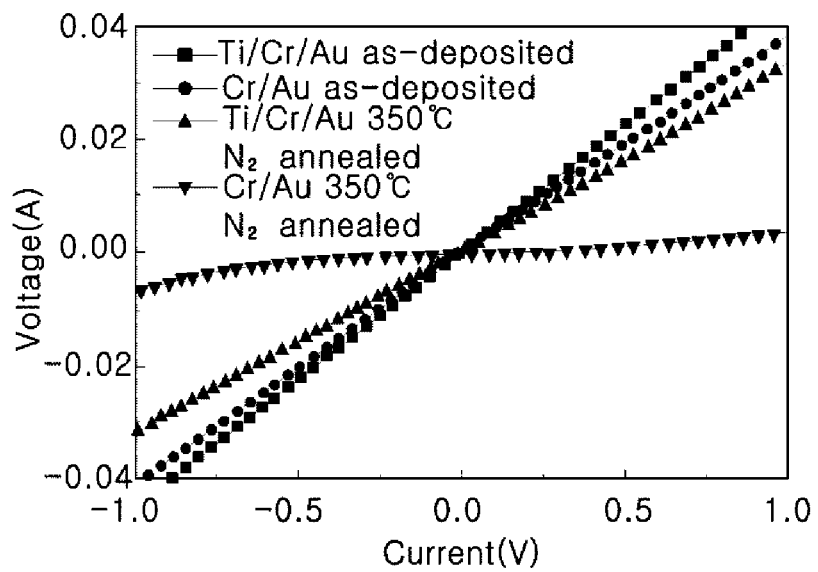
FIG. 6 is a graph depicting current-voltage characteristics of ohmic electrodes according to an inventive example and a comparative example.

FIG. 6 is a graph depicting current-voltage characteristics of ohmic electrodes according to an inventive example and a comparative example, which were measured immediately after deposition and after annealing for 1 minute in a nitrogen atmosphere at about 350° C.

Referring to FIG. 6, the Ag nanodot layer/Ti/Cr/Au ohmic electrode of the inventive example and the Cr/Au ohmic electrode of the comparative example provide substantially similar current-voltage curves immediately after deposition. However, the current-voltage characteristics of the Cr/Au electrode are severely deteriorated immediately after annealing, whereas the Ag nanodot layer/Ti/Cr/Au ohmic electrode maintains the current-voltage characteristics even after annealing. An inverse of a gradient (I/V) of the current-voltage curve means resistance R, and it can be seen that the Ag nanodot layer/Ti/Cr/Au ohmic electrode of the inventive example underwent less variation in resistance than the conventional Cr/Au ohmic electrode of the comparative example, thereby providing excellent thermal stability. As such, the Ag nanodot layer/Ti/Cr/Au ohmic electrode according to the inventive example had excellent thermal stability and maintained ohmic characteristics of low resistance even under a high temperature environment, so that a high electric current could be applied to the semiconductor layer, thereby enabling further improvement of light output from the light emitting diode.

Figure 7:
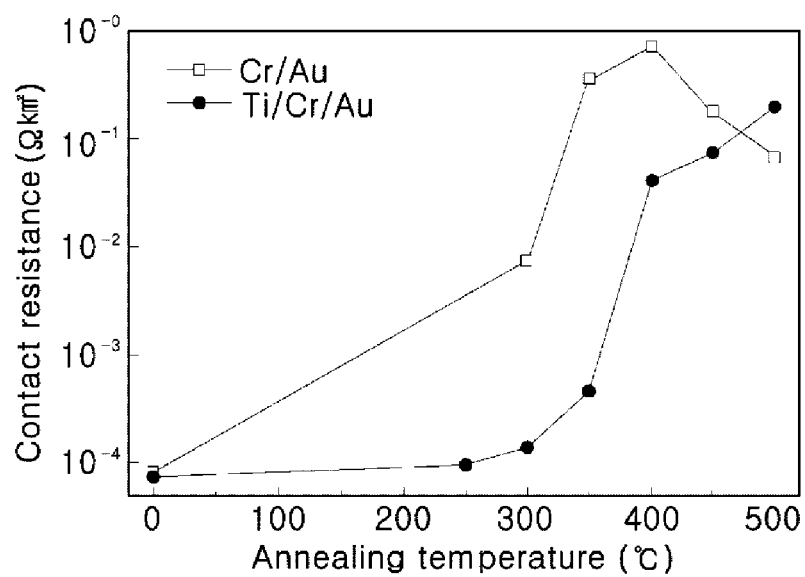
FIG. 7 is a graph depicting variation of contact resistance of the ohmic electrodes according to the inventive example and the comparative example.

FIG. 7 is a graph depicting variation of contact resistance of ohmic electrodes according to the inventive example and the comparative example, in which the variation in contact resistance was measured by changing the temperature of annealing in a nitrogen atmosphere.

In order to find the electrical characteristics of the ohmic electrodes, contact resistance was calculated by a transfer length method (TLM) suggested by Schottky. In the TLM, resistance $R_T$ at 0V is obtained based on current (I)-voltage (V) curve between two electrodes, each of which has a length divided into d1, d2, d3, and d4. Then, the measured resistances $R_T$ according to the distances are depicted by a graph, and extrapolated to calculate the contact resistance according to the following equations.

$$R_T \frac{R_S d}{Z} + 2Re [\Omega]$$

$$r_C = R_C \times Z(\mu m) \times 10^{-4} [\Omega cm]$$

$$\rho_C = \frac{r_C^2}{R_S} [\Omega cm^2]$$

(Here, $R_T$ indicates resistance [Ω] between metal electrodes, $R_S$ indicates a sheet resistance [Ω] of a semiconductor layer, d indicates a distance between the metal electrodes, Z indicates a width of the metal electrodes, and $\rho_C$ indicates contact resistivity.)

Referring to FIG. 7, immediately after deposition, the Ag nanodot layer/Ti/Cr/Au ohmic electrode according to the inventive example had a low contact resistivity of $7.4 \times 10^{-5}$ $\Omega cm^2$ and the Cr/Au ohmic electrode according to the comparative example also had a low contact resistivity of $8.3 \times 10^{-5}$ $\Omega cm^2$. However, after annealing in a nitrogen atmosphere at 350° C., the Cr/Au electrode underwent a rapid increase in contact resistivity to $3.53 \times 10^{-1}$ $\Omega cm^2$, whereas the Ti/Cr/Au ohmic electrode maintained a low contact resistivity of $4.7 \times 10^{-4}$ $\Omega cm^2$. Consequently, it can be confirmed that the Ag nanodot layer/Ti/Cr/Au ohmic electrode according to the inventive example has superior thermal stability to the Cr/Au ohmic electrode according to the comparative example.

Figure 8:
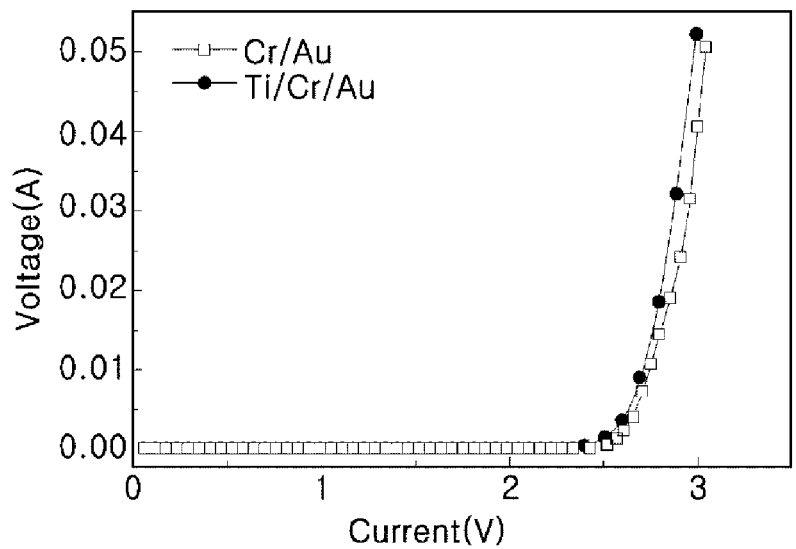
FIG. 8 is a graph depicting current-voltage characteristics of semiconductor light emitting diodes to which the ohmic electrodes according to the inventive example and the comparative example are applied.

FIG. 8 is a graph depicting current-voltage characteristics of semiconductor light emitting diodes to which ohmic electrodes according to the inventive example and the comparative example are applied. Here, the Ag nanodot layer/Ti/Cr/Au electrode after annealing for 1 minute in a nitrogen atmosphere of about 350° C. and the Cr/Au electrode were used.

Referring to FIG. 8, it can be confirmed that the semiconductor light emitting diode including the Ag nanodot layer/Ti/Cr/Au ohmic electrode according to the inventive example had superior current-voltage characteristics to those of the semiconductor light emitting diode including the Cr/Au ohmic electrode according to the comparative example. The Ag nanodot layer/Ti/Cr/Au ohmic electrode exhibited an excellent operation voltage of about 2.8V under the condition that an injection current was 20 mA.

As such, for the ohmic electrode 180 of the Ag nanodot layer/Ti/Cr/Au structure, the Ag nanodot layer 181 enhances charge injection characteristics into the semiconductor layer 120, and the Ti contact layer 182 suppresses intermixing by heat generated under conditions for annealing in a nitrogen atmosphere, high temperature, and high current injection by acting as a diffusion barrier between the n-type layer 121 and the Cr/Au electrodes 183, 184, thereby providing excellent thermal stability. Therefore, the semiconductor light emitting diode including the ohmic electrode of the Ag nanodot layer/Ti/Cr/Au structure has a low operation voltage and improved thermal stability. In addition, such a result can be similarly obtained in the ohmic electrode of the Ag nanodot layer/Ti/Cr/Au structure wherein the nanodot layer is formed of at least one of Al and Au instead of Ag, at least one material selected from among Ti—Al alloys, Ti—Ni alloys, Ta, Al, W and W—Ti alloys may be used instead of Ti, at least one material selected from among Ru, Pt, Ni, Pd, Ir, Rh and Nb may be used instead of Cr, and Al may be used instead of Au.

<Embodiment 2>

Figure 9:
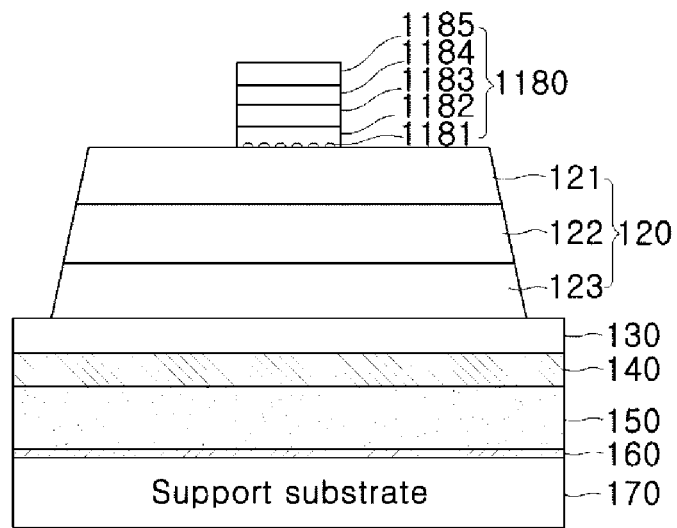
FIG. 9 is a sectional view of a semiconductor light emitting diode according to a second embodiment of the present invention.

FIG. 9 is a sectional view of a semiconductor light emitting diode according to a second embodiment of the present invention.

Referring to FIG. 9, the semiconductor light emitting diode according to the second embodiment includes: a semiconductor layer 120, which includes an n-type layer 121, an active layer 122, and a p-type layer 123; an n-type electrode 1180 formed on an upper surface of the n-type layer 121; and a p-type electrode 130 formed on a lower surface of the p-type layer 123. The semiconductor light emitting diode further includes a support substrate 170 attached to a lower surface of the p-type electrode 130 to support the entire structures 120, 130, 1180. Here, the n-type electrode 1180 is an ohmic electrode of a multilayer structure, which includes a nanodot layer 1181, a contact layer 1182, a reflective layer 1183, an anti-diffusion layer 1184 and a capping layer 1185 formed on the semiconductor layer 120 and is in ohmic contact with the semiconductor layer 120.

The semiconductor layer 120 includes the n-type layer 121, the active layer 122, and the p-type layer 123, and each of the n-type layer 121, the active layer 122 and the p-type layer 123 may be formed of at least one selected from among an Si layer, a GaN layer, an AlN layer, an InGaN layer, an AlGaN layer, an AlInGaN layer, and a combination thereof. For example, the n-type layer 121 and the p-type layer 123 are formed of GaN layers and the active layer 122 is formed of an InGaN layer. The description of the semiconductor layer including the n-type layer 121, the active layer 122 and the p-type layer 123 is the same as the aforementioned embodiment, and thus a repetitive description will be omitted herein.

The n-type electrode 1180 is connected to a negative potential of a driving power source and serves to inject electrons to the n-type layer 121 of the semiconductor layer 120, and the p-type electrode 130 is connected to a positive potential thereof and serves to inject holes to the p-type layer 123 of the semiconductor layer 120. In particular, the n-type electrode 1180 is disposed vertical to the p-type electrode 130, and the p-type electrode 130 constitutes a reflective plane which reflects light generated in the active layer 122 such that most light can be discharged in a direction of the n-type layer 121. Further, the n-type electrode 1180 is the ohmic electrode of the multilayer structure, which includes the nanodot layer 1181, the contact layer 1182, the reflective layer 1183, the anti-diffusion layer 1184, and the capping layer 1185 sequentially formed on an N-face of the semiconductor layer 120.

Here, the nanodot layer 1181 may be formed of at least one material selected from among Ag, Al and Au through annealing in a nitrogen atmosphere. In addition, the contact layer 1182 may be formed of at least one material selected from among Ni, Ni—Ti alloys, Ni—Al alloys, Ti—Al alloys, Mg—Al alloys, Ta, Ti, W, and W—Ti alloys, and the reflective layer 1183 may be formed of at least one material selected from among Al, Ag, Ag—Al alloys, Ag—Cu alloys, Ag—In alloys, Ag—Mg alloys, Al—Cu alloys, Al—In alloys, and Al—Mg alloys. Further, the anti-diffusion layer 1184 may be formed of at least one metal layer selected from among Ti, Cr, Ru, Pt, Ni, Pd, Ir, Rh, Nb, W, and W—Ti alloy layers, or at least one oxide layer selected from among RuOx, NiOx, IrOx, RhOx, NbOx, TiOx, TaOx, and CrOx layers. Further, the capping layer 1185 may be formed of at least one of Au and Al. For example, in the n-type electrode 1180 according to this embodiment, the nanodot layer 1181 is formed of Ag, the contact layer 1182 is formed of Ni, the reflective layer 1183 is formed of Al, the anti-diffusion layer 1184 is formed of Ti, and the capping layer 1185 is formed of Au.

The support substrate 170 serves to support the entire structures 120, 130, 1180, as a growth substrate of the semiconductor layer 120, that is, a base substrate, is removed. In order to allow the support substrate 170 to be attached to the lower surface of the p-type electrode 130, a capping layer 160, a bonding layer 150, and an anti-diffusion layer 140 may be formed between the support substrate 170 and the p-type electrode 130. The anti-diffusion layer 140 serves to prevent the material 120 of the p-type electrode 130 from diffusing into adjacent layers by heat during a process of bonding the p-type electrode 130 and the support substrate 170.

Figure 10:
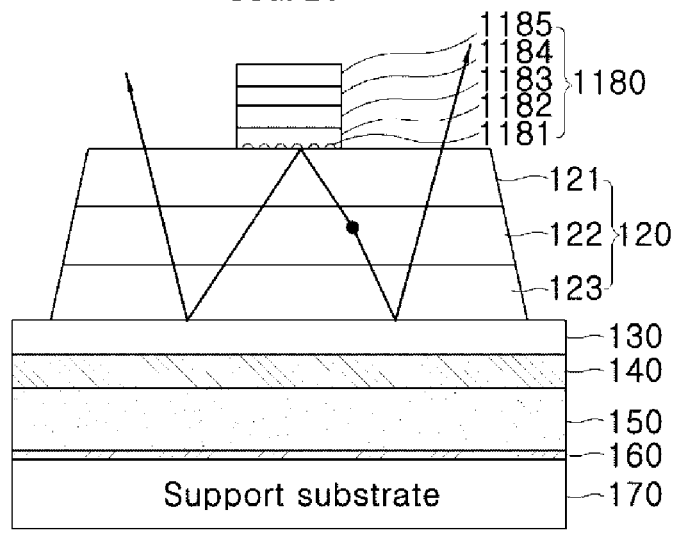
FIG. 10 is a sectional view of a process for manufacturing the semiconductor light emitting diode according to the second embodiment of the present invention.

A process of manufacturing the semiconductor light emitting diode constructed as described above is the same as the process of manufacturing the semiconductor light emitting diode described with reference to FIG. 2 to FIG. 4, except that the n-type electrode 1180 of the Ag nanodot layer/Ni/Al/Ti/Au structure is formed on the semiconductor layer 120. Thus, in description of the process with reference to FIG. 10, a repetitive description will be omitted for clarity. FIG. 10 is a sectional view of the process for manufacturing the semiconductor light emitting diode according to the second embodiment of the present invention.

Referring to FIG. 10, Ag is thinly deposited to a thickness of about 5 Å to 50 Å on the surface of the n-type layer 121 of the exposed semiconductor layer 120, followed by annealing in a nitrogen atmosphere, thereby forming an Ag nanodot layer 1181 composed of nanometer scale dots. The Ag nanodot layer 1181 is formed on an N-face of the n-type layer 121. Then, an Ni contact layer 1182, an Al reflective layer 1183, a Ti anti-diffusion layer 1184, and an Au capping layer 1185 are stacked on the Ag nanodot layer 1181, followed by patterning to form an n-type electrode 1180 of the Ag nanodot layer/Ni/Al/Ti/Au.

Here, if the thickness of the Ag nanodot layer 1181 is less than 5 Å, current injection efficiency is reduced due to an excessively small size of the dots, and if the thickness of the dot-type layer 1181 is greater than 50 Å, it is difficult to form the dots. Accordingly, the Ag nanodot layer 1181 is preferably formed to a thickness of 5 Å to 50 Å. If the thickness of the Ni contact layer 1182 is less than 1 Å, it cannot act as the contact layer, and if the thickness of the Ni contact layer 1182 is greater than 50 Å, optical transmittance can be deteriorated due to absorption of light. Thus, the Ni contact layer 1182 is preferably formed to a thickness of 1 Å to 50 Å. The Al reflective layer 1183 needs a thickness of at least 500 Å to obtain high reflectivity, but if the Al reflective layer 1183 has a thickness exceeding 8000 Å, thermal stability of the electrode can be deteriorated by migration of Al. Thus, the Al reflective layer 1183 is preferably formed to a thickness of 500 Å to 8000 Å. The Ti anti-diffusion layer 1184 having a thickness of less than 100 Å is insufficient in prevention of migration, and the Ti anti-diffusion layer 1184 having a thickness of greater than 1000 Å can cause degradation in adhesion due to an increase of stress within the thin layer resulting from the thickness increase. Thus, the Ti anti-diffusion layer 183 is preferably formed to a thickness of 100 Å to 1000 Å. If the Au capping layer 1185 has a thickness of less than 1000 Å, the capping layer 1185 is not suitable for wire bonding, and if the capping layer 1185 has a thickness of greater than 10000 Å, there is a problem of increase in manufacturing cost. Thus, the capping layer 1185 is preferably formed to a thickness of 1000 Å to 10000 Å. For example, in this embodiment, the Ag nanodot layer, the Ni contact layer, the Al reflective layer, the Ti anti-diffusion layer, and the Au capping layer are sequentially formed, for example, to thicknesses of 20 Å/10 Å/2000 Å/200 Å/5000 Å on the semiconductor layer 120 by an e-beam evaporator.

Then, after forming the n-type electrode 1180 and the p-type electrode 1130, annealing may be further performed in an atmosphere containing nitrogen and oxygen at 150° C. to 600° C. for improvement of adhesion and ohmic characteristics while guaranteeing thermal reliability.

Meanwhile, in order to find characteristics of the n-type electrode 1180 in ohmic contact with the semiconductor layer 120 in the semiconductor light emitting diode according to the second embodiment, semiconductor light emitting diodes according to an inventive example and a conventional example were prepared. The inventive example employed the Ag nanodot layer/Ti/Cr/Au ohmic electrode according to the second embodiment, and the comparative example employed a conventional Cr/Au ohmic electrode.

Figure 11:
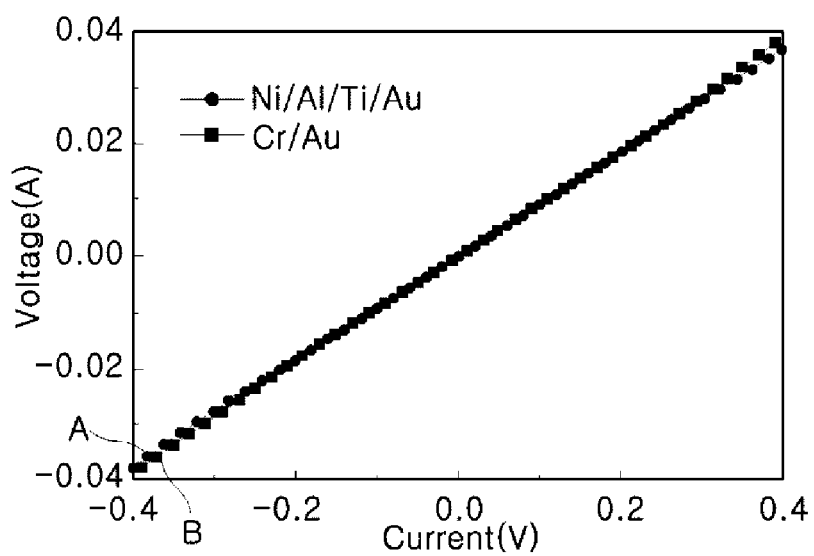
FIG. 11 is a graph depicting current-voltage characteristics of ohmic electrodes according to an inventive example and a comparative example.

FIG. 11 is a graph depicting current-voltage characteristics of ohmic electrodes according to the inventive example and the comparative example, in which line A is a current-voltage graph of the Ag nanodot layer/Ni/Al/Ti/Au ohmic electrode according to the inventive example and line B is a is a current-voltage graph of the Cr/Au ohmic electrode according to the comparative example.

In order to find the electrical characteristics of the ohmic electrodes, ohmic resistivity was calculated by the TLM suggested by Schottky.

According to the current-voltage curve of FIG. 11 and the TLM, the Cr/Au ohmic electrode according to the comparative example has an ohmic resistivity of about $8.3 \times 10^{-5}$ $\Omega cm^2$, whereas the Ag nanodot layer/Ni/Al/Ti/Au ohmic electrode according to the inventive example has an ohmic resistivity of $7.4 \times 10^{-5}$ $\Omega cm^2$. As such, since the Ag nanodot layer/Ni/Al/Ti/Au ohmic electrode according to the inventive example has lower ohmic resistivity than the conventional Cr/Au ohmic electrode according to the comparative example even without additional annealing after deposition, thereby enabling reduction in power consumption of the light emitting diode through reduction of operating voltage.

Figure 12:
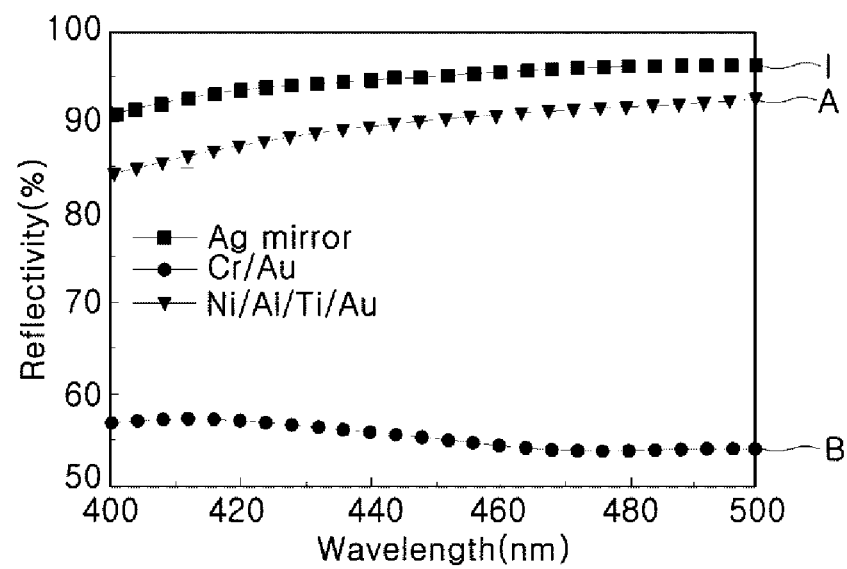
FIG. 12 is a graph depicting reflectivity of the ohmic electrodes according to the inventive example and the comparative example.

FIG. 12 is a graph depicting reflectivity of the ohmic electrodes according to the inventive example and the comparative example, which was measured at a wavelength of 460 nm. In FIG. 12, line A indicates reflectivity of the Ag nanodot layer/Ni/AUTi/Au ohmic electrode according to the inventive example, and line B indicates reflectivity of the Cr/Au ohmic electrode according to the comparative example. Further, line I is a reference line and indicates reflectivity of an Ag mirror.

Referring to FIG. 12, the Cr/Au ohmic electrode according to the comparative example has a low reflectivity of about 55% of the reference line (line B), whereas the Ag nanodot layer/Ni/Al/Ti/Au ohmic electrode according to the inventive example has a high reflectivity of about 88% of the reference line (line A). Accordingly, the Ag nanodot layer/Ni/Al/Ti/Au ohmic electrode according to the inventive example may further enhance light output through reduction of absorption of light.

As such, the ohmic electrode 1180 of the Ag nanodot layer/Ni/Al/Ti/Au structure is formed on the N-face of the semiconductor layer 120 and exhibits low ohmic resistivity and high reflectivity without additional annealing. Such effects are obtained since the Ag nanodot layer 1181 enhances charge injection characteristics into the semiconductor layer 120. Further, such a result can be similarly obtained in the ohmic electrode of the Ag nanodot layer/Ti/Cr/Au structure wherein the nanodot layer is formed of at least one of Al and Au instead of Ag, at least one material selected from among Ni—Ti alloys, Ni—Al alloys, Ti—Al alloys, Mg—Al alloys, Ta, Ti, W and W—Ti alloys may be used instead of Ni, at least one material selected from among Ag, Ag—Al alloys, Ag—Cu alloys, Ag—In alloys and Ag—Mg alloys may be used instead of Al, at least one metal layer selected from among Cr, Ru, Pt, Ni, Pd, Ir, Rh, Nb, W and W—Ti alloy layers, or at least one oxide layer selected from among RuOx, NiOx, IrOx, RhOx, NbOx, TiOx, TaOx and CrOx layers may be used instead of Ti, and Al may be used instead of Au.

<Embodiment 3>

The ohmic electrode of the Ag nanodot layer/Ti/Cr/Au structure according to the present invention may also be applied to a lateral type semiconductor light emitting diode. Next, a semiconductor light emitting diode according to a third embodiment, in which an n-type electrode and a p-type electrode are disposed in a lateral structure, will be described. Here, a repetitive description will be omitted or will be described in brief.

Figure 13:
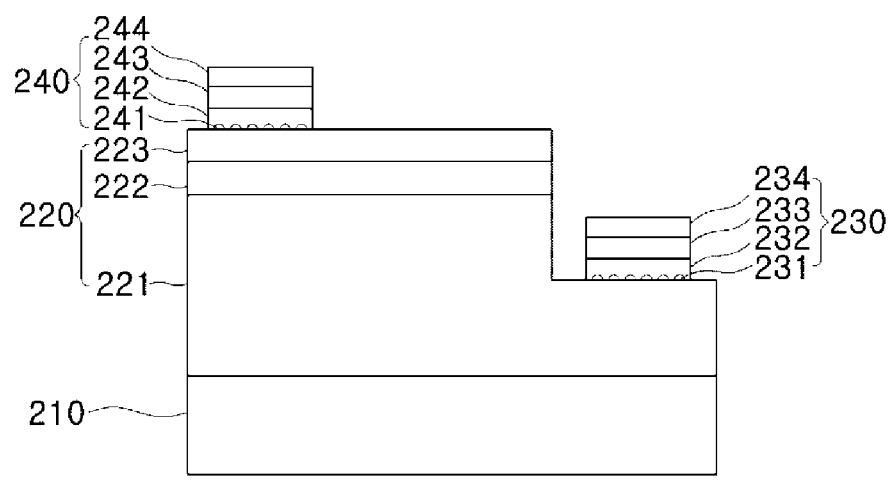
FIG. 13 is a sectional view of a semiconductor light emitting diode according to a third embodiment of the present invention.

FIG. 13 is a sectional view of, the semiconductor light emitting diode according to the third embodiment of the present invention.

Referring to FIG. 13, the semiconductor light emitting diode according to the third embodiment includes a semiconductor layer 220, which includes an n-type layer 221, an active layer 222, and a p-type layer 223 sequentially formed on a substrate 210; an n-type electrode 230 formed on an exposed region of the n-type layer 221; and a p-type electrode 240 formed on the p-type layer 223. Here, at least one of the n-type electrode 230 and the p-type electrode 240 is an ohmic electrode of a multilayer structure, which includes a nanodot layer 231/241, a contact layer 232/242, an anti-diffusion layer 233/243, and a capping layer 234/244 formed on the semiconductor layer 220, and is in ohmic contact with the semiconductor layer 120.

Next, a process of manufacturing the semiconductor light emitting diode having the configuration as described above will be described with reference to FIG. 14 to FIG. 16. Here, FIG. 14 to FIG. 16 are sectional views of a process for manufacturing the semiconductor light emitting diode according to the third embodiment of the present invention.

Figure 14:
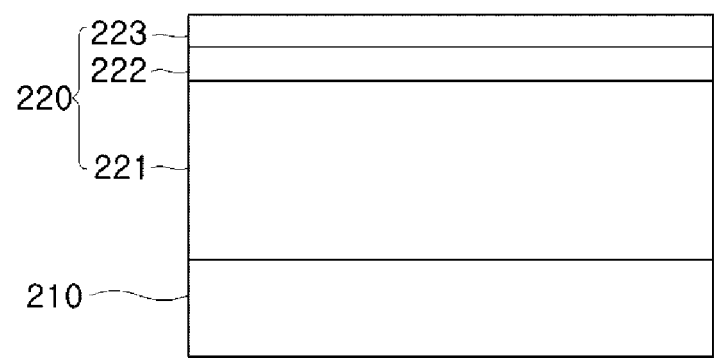
FIG. 14 to FIG. 16 are sectional views of a process for manufacturing the semiconductor light emitting diode according to the third embodiment of the present invention.

Referring to FIG. 14, a semiconductor layer 220 of a multilayer structure is formed by sequentially stacking an n-type layer 221, an active layer 222 and a p-type layer 223 on a prepared substrate 210. The substrate 210 may be a sapphire ($Al_2O_3$) substrate, a silicon carbide substrate, a silicon substrate, a zinc oxide substrate, a gallium arsenide substrate, or a gallium phosphide substrate. Particularly, a sapphire substrate may be advantageously used.

The semiconductor layer 220 may be composed of at least one layer selected from among an Si layer, a GaN layer, an AlN layer, an InGaN layer, an AlGaN layer, an AlInGaN layer, and a combination thereof. In this embodiment, the n-type layer 221 is formed by depositing a thin GaN layer and injecting n-type impurities thereto, and the active layer 222 of a multi-quantum well structure is formed by alternately depositing a thin GaN layer as a barrier layer and a thin InGaN layer as a well layer thereon. Then, the p-type layer 223 is formed thereon by depositing a thin GaN layer and injecting p-type impurities. Although not shown in the drawings, a buffer layer may be further added between the substrate 210 and the n-type layer 221 to relieve stress resulting from lattice mismatch between the substrate 210 and the n-type layer 221 in order to help efficient growth of the n-type layer 221 which will be formed in a subsequent process.

Figure 15:
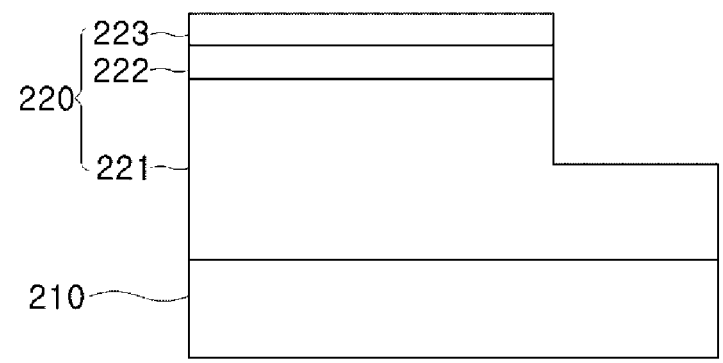
Figure 16:
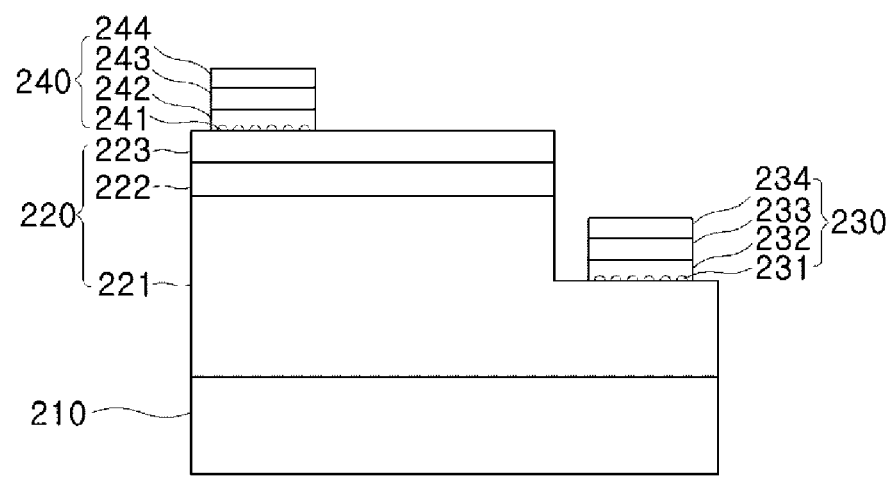

Referring to FIG. 15, some region of the p-type layer 223 and the active layer 222 is subjected to mesa etching to expose part of the n-type layer 221 on which the n-type electrode 230 will be formed. Then, the semiconductor layer 220 may be subjected to surface treatment to enhance interface characteristics with the subsequent layer.

Referring to FIG. 16, Ag is thinly deposited to a thickness of about 5 Å to 50 Å on the exposed surfaces of the n-type layer 221 and the p-type layer 223, followed by annealing in a nitrogen atmosphere, thereby forming Ag nanodot layers 231/241 composed of nanometer scale dots. The Ag nanodot layers 231/241 are formed on Ga-faces of the n-type layer 221 and the p-type layer 223. Then, Ti contact layers 232/242, Cr anti-diffusion layers 233/243, and Au capping layers 234/244 are stacked on the Ag nanodot layers 231/241, followed by patterning to form an n-type electrode 230 and a p-type electrode 240 of the Ag nanodot layer/Ti/Cr/Au structure. Here, the nanodot layer may be formed of at least one of Al and Au instead of Ag. Further, at least one material selected from among Ti—Al alloys, Ti—Ni alloys, Ta, Al, W, and W—Ti alloys may be used instead of Ti, at least one material selected from among Ru, Pt, Ni, Pd, Ir, Rh, Nb may be used instead of Cr, and Al may be used instead of Au.

Then, after forming the n-type electrode 230 and the p-type electrode 240, annealing may be further performed in an atmosphere containing nitrogen and oxygen at 150° C. to 600° C. for improvement of adhesion and ohmic characteristics while guaranteeing thermal reliability.

In such ohmic electrodes 230/240 of the Ag nanodot layer/Ti/Cr/Au structure, the Ag nanodot layers 231/241 enhance charge injection characteristics into the semiconductor layer 220, the Ti contact layers 232/242 suppress intermixing by heat generated under conditions for annealing in a nitrogen atmosphere, high temperature, and high current injection by acting as diffusion barriers between the n-type layer and the Cr/Au electrodes 233/243,234/244, thereby providing excellent thermal stability. Therefore, the semiconductor light emitting diode including the ohmic electrodes 230/240 of the Ag nanodot layer/Ti/Cr/Au structure has a lower operation voltage and improved thermal stability.

<Embodiment 4>

The ohmic electrode of the Ag nanodot layer/Ti/Cr/Au structure according to the present invention may also be applied to a lateral type semiconductor light emitting diode. Next, a semiconductor light emitting diode according to a fourth embodiment, in which an n-type electrode and a p-type electrode are disposed in a lateral structure, will be described. Here, a repetitive description will be omitted or will be described in brief.

Figure 17:
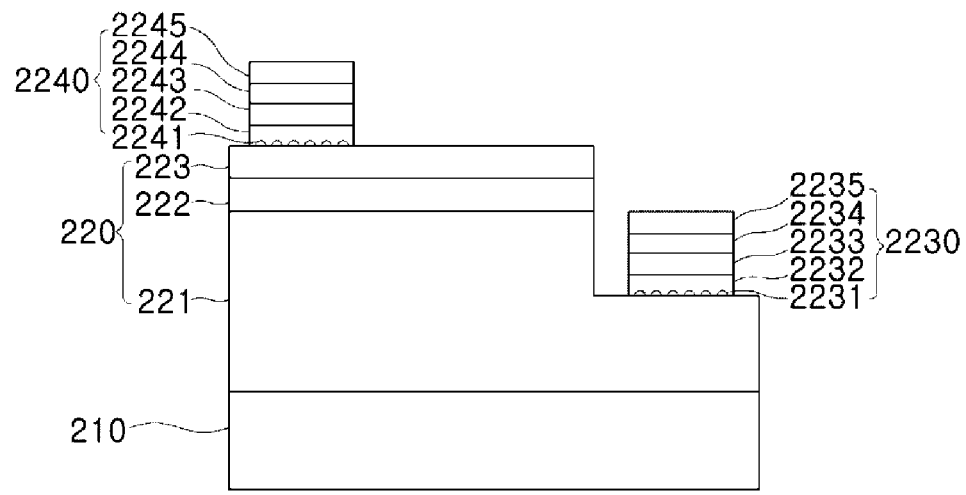
FIG. 17 is a sectional view of a semiconductor light emitting diode according to a fourth embodiment of the present invention.

FIG. 17 is a sectional view of the semiconductor light emitting diode according to the fourth embodiment of the present invention.

Referring to FIG. 17, the semiconductor light emitting diode according to the fourth embodiment includes a semiconductor layer 220, which includes an n-type layer 221, an active layer 222, and a p-type layer 223 sequentially formed on a substrate 210; an n-type electrode 2230 formed on an exposed region of the n-type layer 121; and a p-type electrode 2240 formed on the p-type layer 223. Here, at least one of the n-type electrode 2230 and the p-type electrode 2240 is an ohmic electrode of a multilayer structure, which includes a nanodot layer 2231/2241, a contact layer 2232/2242, a reflective layer 2233/2243, an anti-diffusion layer 2234/2244, and a capping layer 2235/2245 formed on the semiconductor layer 220, and is in ohmic contact with the semiconductor layer 220.

Figure 18:
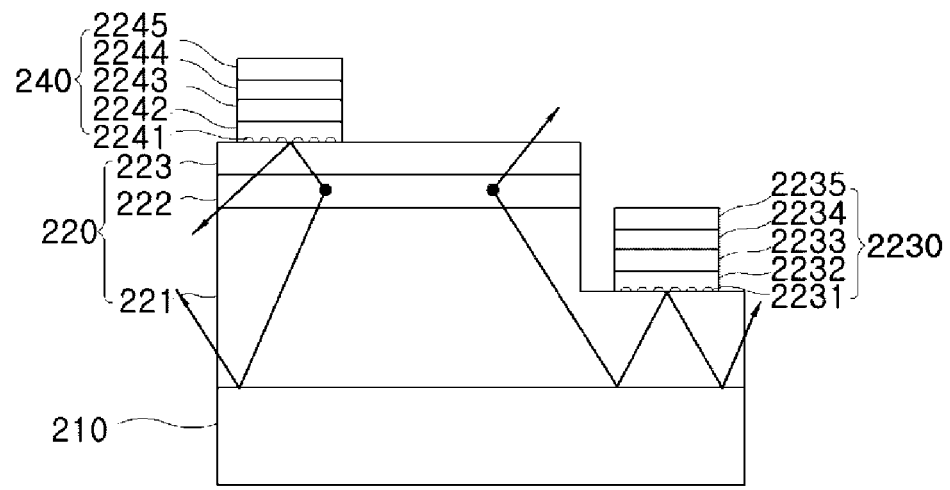
FIG. 18 is a sectional view of a process for manufacturing the semiconductor light emitting diode according to the fourth embodiment of the present invention.

A process of manufacturing the semiconductor light emitting diode constructed as described above is the same as those of the process described with reference to FIG. 14 and FIG. 15, except that the n-type electrode 1230 and/or the p-type electrode 2240 of the Ag nanodot layer/Ni/Al/Ti/Au structure are/is formed on the semiconductor layer 220. Thus, in description of the process with reference to FIG. 18, a repetitive description will be omitted for clarity. FIG. 18 is a sectional view of the process for manufacturing the semiconductor light emitting diode according to the fourth embodiment of the present invention.

Referring to FIG. 18, Ag is thinly deposited to a thickness of about 5 Å to 50 Å on the exposed surfaces of the n-type layer 221 and the p-type layer 223, followed by annealing in a nitrogen atmosphere, thereby forming Ag nanodot layers 2231/2241 composed of nanometer scale dots. The Ag nanodot layers 2231/2241 are formed on Ga-faces of the n-type layer 221 and the p-type layer 223. Then, Ni contact layers 2232/2242, Al reflective layers 2233/2243, Ti anti-diffusion layers 2234/2244, and Au capping layers 2235/2245 are stacked on the Ag nanodot layers 2231/2241, followed by patterning to form an n-type electrode 2230 and a p-type electrode 2240 having the Ag nanodot layer/Ni/Al/Ti/Au structure. Here, the nanodot layer may be formed of at least one of Al and Au instead of Ag. Further, at least one material selected from among Ni—Ti alloys, Ni—Al alloys, Ti—Al alloys, Mg—Al alloys, Ta, Ti, W and W—Ti alloys may be used instead of Ni, at least one material selected from among Ag, Ag—Al alloys, Ag—Cu alloys, Ag—In alloys, Ag—Mg alloys, Al—Cu alloys, Al—In alloys and Al—Mg alloys may be used instead of Al, at least one metal layer selected from among Cr, Ru, Pt, Ni, Pd, Ir, Rh, Nb, W and W—Ti alloy layers, or at least one oxide layer selected from among RuOx, NiOx, IrOx, RhOx, NbOx, TiOx, TaOx and CrOx layers may be used instead of Ti, and Al may be used instead of Au.

Then, after forming the n-type electrode 2230 and the p-type electrode 2240, annealing may be further performed in an atmosphere containing nitrogen and oxygen at 150° C. to 600° C. for improvement of adhesion and ohmic characteristics while guaranteeing thermal reliability.

In such a lateral type semiconductor light emitting diode as shown in FIG. 18, most light emitted from the active layer 222 can be discharged instead of being absorbed into the n-type electrode 2230, which has high reflectivity, thereby providing further improved light output.

Figure 19:
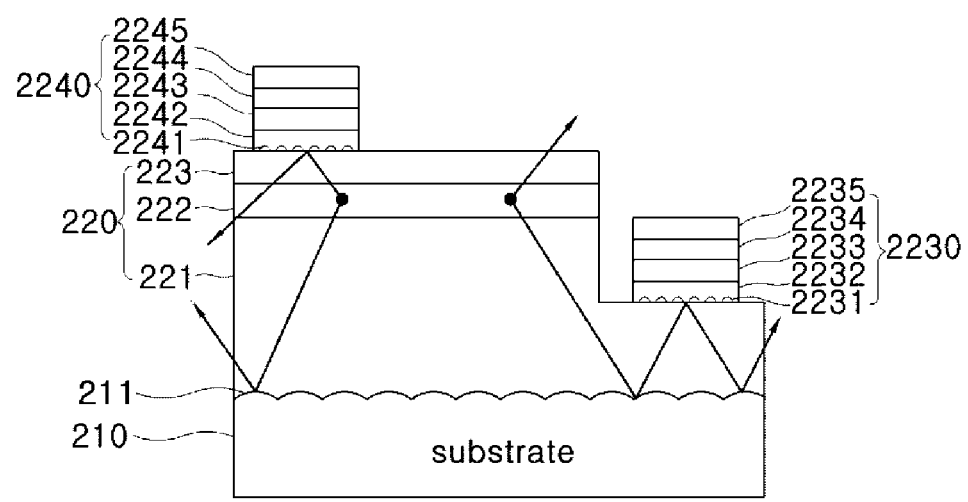
FIG. 19 is a sectional view of a semiconductor light emitting diode according to a first modification of the present invention.

FIG. 19 is a sectional view of a semiconductor light emitting diode according to a first modification of the present invention.

Referring to FIG. 19, a semiconductor light emitting diode includes a semiconductor layer 220 formed on a substrate 210 which has a diffused reflection pattern 211 on an upper surface thereof. The diffused reflection pattern 211 may have a semi-spherical structure. Such a semi-spherical pattern 211 induces diffused reflection of light emitted from the active layer 222, thereby providing further improved light output.

In such a lateral type semiconductor light emitting diode as shown in FIG. 19, most light emitted from the active layer 222 can be discharged without being absorbed into the n-type electrode 2230, which has high reflectivity, thereby providing further improved light output.

Although the present invention has been illustrated with reference to some embodiments in conjunction of the accompanying drawings, it should be understood that the embodiments are provided for illustration only and are not intended to limit the scope of the invention, which is limited only by the attached claims and equivalents thereof.

Therefore, it will be apparent to those skilled in the art that various modifications and changes can be made to the invention without departing from the spirit and scope of the invention.

The invention claimed is:

1. A semiconductor light emitting diode comprising:
a semiconductor layer; and
an ohmic electrode comprising a nanodot layer, a contact layer, an anti-diffusion layer, and a capping layer disposed on the semiconductor layer,
wherein the nanodot layer is disposed on an N-face of the semiconductor layer and comprises at least one of Ag, Al and Au,
the contact layer comprises at least one material selected from among Ti, Ti—Al alloys, Ti—Ni alloys, Ta, Al, W, and W—Ti alloys,
the anti-diffusion layer comprises at least one metal layer selected from Cr, Ru, Pt, Ni, Pd, Ir, Rh, and Nb layers, or at least one oxide layer selected from among RuOx, NiOx, IrOx, RhOx, NbOx, TiOx, TaOx, and CrOx layers,
and the capping layer comprises at least one of Au and Al.

2. The semiconductor light emitting diode of claim 1, wherein the nanodot layer comprises Ag dots formed at nanometer scale.

3. The semiconductor light emitting diode of claim 1, wherein the nanodot layer has a thickness of 5 Å to 50 Å.

4. The semiconductor light emitting diode of claim 1, wherein the contact layer comprises Ti, the anti-diffusion layer comprises Cr, and the capping layer comprises Au.

5. The semiconductor light emitting diode of claim 1, wherein the contact layer has a thickness of 1 Å to 1000 Å.

6. The semiconductor light emitting diode of claim 1, wherein the anti-diffusion layer has a thickness of 1000 Å to 3000 Å.

7. The semiconductor light emitting diode of claim 1, wherein the semiconductor layer comprises an n-type layer, an active layer and a p-type layer, and the ohmic electrode is disposed on the N-face of the n-type layer.

8. A method of manufacturing a semiconductor light emitting diode, comprising:
forming a semiconductor layer;
forming a nanodot layer on an N-face of the semiconductor layer; and forming an ohmic electrode comprising a contact layer, a reflective layer, an anti-diffusion layer, and a capping layer on the nanodot layer, wherein the nanodot layer comprises at least one of Ag, Al and Au, the contact layer comprises at least one material selected from among Ti, Ti—Al alloys, Ti—Ni alloys, Ta, Al, W, and W—Ti alloys, the anti-diffusion layer comprises at least one metal layer selected from among Cr, Ru, Pt, Ni, Pd, Ir, Rh, and Nb layers, or at least one oxide layer selected from among RuOx, NiOx, IrOx, RhOx, NbOx, TiOx, TaOx, and CrOx layers, and the capping layer comprises at least one of Au and Al.

9. The method of claim 8, wherein the nanodot layer is formed by depositing Ag on the N-face of the semiconductor layer, followed by annealing in a nitrogen atmosphere.

10. The method of claim 8, wherein the contact layer comprises Ti, the anti-diffusion layer comprises Cr, and the capping layer comprises Au.

11. The method of claim 8, further comprising: performing surface treatment with respect to the semiconductor layer before forming the ohmic electrode.

12. A semiconductor light emitting diode comprising:
a semiconductor layer; and
an ohmic electrode comprising a nanodot layer, a contact layer, a reflective layer, an anti-diffusion layer, and a capping layer disposed on the semiconductor layer,
wherein the nanodot layer is disposed on an N-face of the semiconductor layer and comprises at least one of Ag, Al and Au,
the contact layer comprises at least one material selected from among Ni, Ni—Ti alloys, Ni—Al alloys, Ti—Al alloys, Mg—Al alloys, Ta, Ti, W, and W—Ti alloys,
the reflective layer comprises at least one material selected from among Al, Ag, Ag—Al alloys, Ag—Cu alloys, Ag—In alloys, Ag—Mg alloys, Al—Cu alloys, Al—In alloys, and Al—Mg alloys,
the anti-diffusion layer comprises at least one metal layer selected from among Ti, Cr, Ru, Pt, Ni, Pd, Ir, Rh, Nb, W and W—Ti alloy layers, or at least one oxide layer selected from among RuOx, NiOx, IrOx, RhOx, NbOx, TiOx, TaOx and CrOx layers, and
the capping layer comprises at least one of Au and Al.

13. The semiconductor light emitting diode of claim 12, wherein the nanodot layer comprises Ag dots formed at nanometer scale.

14. The semiconductor light emitting diode of claim 12, wherein the nanodot layer has a thickness of 5 Å to 50 Å.

15. The semiconductor light emitting diode of claim 12, wherein the contact layer comprises Ni, the reflective layer comprises Al, the anti-diffusion layer comprises Ti, and the capping layer comprises Au.

16. The semiconductor light emitting diode of claim 12, wherein the contact layer has a thickness of 1 Å to 50 Å.

17. The semiconductor light emitting diode of claim 12, wherein the reflective layer has a thickness of 100 Å to 8000 Å.

18. The semiconductor light emitting diode of claim 12, wherein the semiconductor layer comprises an n-type layer, an active layer and a p-type layer, and the ohmic electrode is disposed on the N-face of the n-type layer.

19. A method of manufacturing a semiconductor light emitting diode, comprising:
forming a semiconductor layer;
forming a nanodot layer on an N-face of the semiconductor layer; and
forming an ohmic electrode comprising a contact layer, a reflective layer, an anti-diffusion layer, and a capping layer on the nanodot layer,
wherein the nanodot layer comprises at least one of Ag, Al and Au, the contact layer comprises at least one material selected from among Ni, Ni—Ti alloys, Ni—Al alloys, Ti—Al alloys, Mg—Al alloys, Ta, Ti, W and W—Ti alloys, the reflective layer comprises at least one material selected from among Al, Ag, Ag—Al alloys, Ag—Cu alloys, Ag—In alloys, Ag—Mg alloys, Al—Cu alloys, Al—In alloys, and Al—Mg alloys, the anti-diffusion layer comprises at least one metal layer selected from among Ti, Cr, Ru, Pt, Ni, Pd, Ir, Rh, Nb, W and W—Ti alloy layers, or at least one oxide layer selected from among RuOx, NiOx, IrOx, RhOx, NbOx, TiOx, TaOx and CrOx layers, and the capping layer comprises at least one of Au and Al.

20. The method of claim 19, wherein the nanodot layer is formed by depositing Ag on the N-face of the semiconductor layer, followed by annealing in a nitrogen atmosphere.

21. The method of claim 19, wherein the contact layer comprises Ni, the reflective layer comprises Al, the anti-diffusion layer comprises Ti, and the capping layer comprises Au.

* * * * *